(12) United States Patent
Fang et al.

(10) Patent No.: US 10,681,804 B2
(45) Date of Patent: Jun. 9, 2020

(54) FLEXIBLE CIRCUIT BOARD, OPTICAL TRANSCEIVER ASSEMBLY, AND OPTICAL MODULE

(71) Applicant: InnoLight Technology (Suzhou) LTD., Suzhou, Jiangsu (CN)

(72) Inventors: Xigui Fang, Jiangsu (CN); Qin Chen, Jiangsu (CN); Yunfei Hou, Jiangsu (CN); Jie Zhou, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 0 days.

(21) Appl. No.: 16/190,400

(22) Filed: Nov. 14, 2018

(65) Prior Publication Data
US 2019/0174620 A1 Jun. 6, 2019

(30) Foreign Application Priority Data
Nov. 16, 2017 (CN) .......................... 2017 1 137497

(51) Int. Cl.
| | |
|---|---|
| H05K 1/02 | (2006.01) |
| G02B 6/42 | (2006.01) |
| H04B 10/40 | (2013.01) |
| H05K 1/03 | (2006.01) |
| H05K 1/11 | (2006.01) |
| H05K 1/14 | (2006.01) |
| H05K 1/18 | (2006.01) |
| H05K 3/06 | (2006.01) |

(52) U.S. Cl.
CPC .............. *H05K 1/028* (2013.01); *G02B 6/42* (2013.01); *H04B 10/40* (2013.01); *H05K 1/0353* (2013.01); *H05K 1/111* (2013.01); *H05K 1/113* (2013.01); *H05K 1/118* (2013.01); *H05K 1/144* (2013.01); *H05K 1/181* (2013.01); *H05K 3/06* (2013.01); *H05K 1/189* (2013.01); *H05K 2201/015* (2013.01); *H05K 2201/0141* (2013.01); *H05K 2201/0154* (2013.01); *H05K 2201/10121* (2013.01)

(58) Field of Classification Search
CPC ...... H05K 1/028; H05K 1/0353; H05K 1/111; H05K 1/144; H05K 1/181; H04B 10/40
USPC .......................................................... 361/749
See application file for complete search history.

(56) References Cited

FOREIGN PATENT DOCUMENTS

| | | |
|---|---|---|
| CN | 200976711 Y | 11/2007 |
| CN | 103278891 B | 4/2016 |

*Primary Examiner* — Tremesha S Willis
(74) *Attorney, Agent, or Firm* — Finnegan, Henderson, Farabow, Garrett & Dunner, LLP

(57) ABSTRACT

A flexible circuit board, and an optical transceiver assembly and an optical module that have such flexible circuit board. The flexible circuit board includes a substrate body, a transmission metal layer formed on at least one surface of the substrate body, a strengthening layer formed on the transmission metal layer, and a surface metal layer formed on a portion of an outer surface of the strengthening layer. The surface metal layer constitutes a securing portion for securing and connecting to an external element. A portion of the flexible circuit board that is not covered by the surface metal layer constitutes a connecting portion that connects to the securing portion. The surface metal layer is electrically connected to the transmission metal layer.

10 Claims, 4 Drawing Sheets

FLEXIBLE CIRCUIT BOARD, OPTICAL TRANSCEIVER ASSEMBLY, AND OPTICAL MODULE

CROSS-REFERENCE TO RELATED APPLICATION

This application is based upon and claims priority to Chinese Patent Application 201711137497.1, filed on Nov. 16, 2017, the entire content of which is incorporated herein by reference.

FIELD OF THE DISCLOSURE

This disclosure relates to a flexible circuit board and an optical transceiver assembly and an optical module that have such flexible circuit board, and belongs to the technical field of optical communication element manufacturing.

BACKGROUND

Due to the advantages that flexible circuit boards provide, such as light weight, thinness, flexibility, and bendability, flexible circuit boards are widely used in optical modules and, in particular, used for securing and connecting to external elements to realize interconnection between a plurality of external elements. In order to obtain higher bandwidth, high frequency design requires that a base of a metal housing of a TO-CAN (Transistor Outline-Can) be electrically connected to a GND (ground) reference layer of the flexible circuit board by means of soldering. FIG. 1 is a cross-sectional structural diagram illustrating a flexible circuit board secured and connected to an external element in a conventional technology. As illustrated in FIG. 1, a flexible circuit board 9 usually includes, stacked in the following order, a cover film 91, an adhesive layer 92, a signal layer 93, a substrate 94, a ground layer 95, an adhesive layer 96, and a cover film 97. The signal layer 93 and the ground layer 95 are made of copper. In order to make the flexible circuit board 9 be soldered and connected to an external element 8 through a tin solder layer 89, usually the ground layer 95 beneath a securing portion 902 is exposed by means of opening a window in the cover film 97 (i.e., removing a portion of the cover film 97 that covers the securing portion 902 of the flexible circuit board 9). The flexible circuit board 9 also includes a connecting portion 901 which may be bent when the flexible circuit board 9 is being used. Although not labeled in FIG. 1, the flexible circuit board 9 also includes a copper plating layer formed between the substrate 94 and the tin solder layer 89.

However, in a subsequent electroplating process of the flexible circuit board 9, the thickness and hardness of the metal at the securing portion 902 increase as a result of joining the ground layer 95 and the tin solder layer 89. Thus, in the process of bending and using the flexible circuit board 9, it is possible for the ground layer 95 to break along a line "m" (as illustrated in FIG. 1) where the thickness of the metal changes, leading to low structural strength and poor functionality of the flexible circuit board 9 and even a waste of products.

SUMMARY

In order to achieve the aforementioned purposes, embodiments of the present disclosure provide a flexible circuit board including a substrate body, a transmission metal layer formed on at least one surface of the substrate body, a strengthening layer formed on the transmission metal layer, and a surface metal layer formed on a portion of an outer surface of the strengthening layer. The surface metal layer of the flexible circuit board constitutes a securing portion for securing and connecting to an external element. A portion on the flexible circuit board that is not covered by the surface metal layer constitutes a connecting portion that connects to the securing portion. The surface metal layer is electrically connected to the transmission metal layer.

Embodiments of the present disclosure also provide an optical transceiver assembly including at least one of an optical transmitting element or an optical receiving element and the flexible circuit board. The flexible circuit board is secured and connected to the at least one of the optical transmitting element or the optical receiving element through the securing portion.

Embodiments of the present disclosure further provide an optical module including at least one of an optical transmitting element or an optical receiving element, a rigid circuit board, and the flexible circuit board. The flexible circuit board is connected to the at least one of the optical transmitting element or the optical receiving element and the rigid circuit board through the securing portion.

DETAILED DESCRIPTION

The text below provides detailed descriptions of this disclosure by referencing specific embodiments illustrated in the attached drawings. However, these embodiments do not limit this invention; the scope of protection for this invention covers changes made to the structure, method, or function by persons having ordinary skill in the art on the basis of these embodiments.

A purpose of this disclosure is to provide a flexible circuit board and an optical transceiver assembly and an optical module that have such flexible circuit board to address the problem of poor structural strength of flexible circuit boards in currently available technology.

Figure 1:
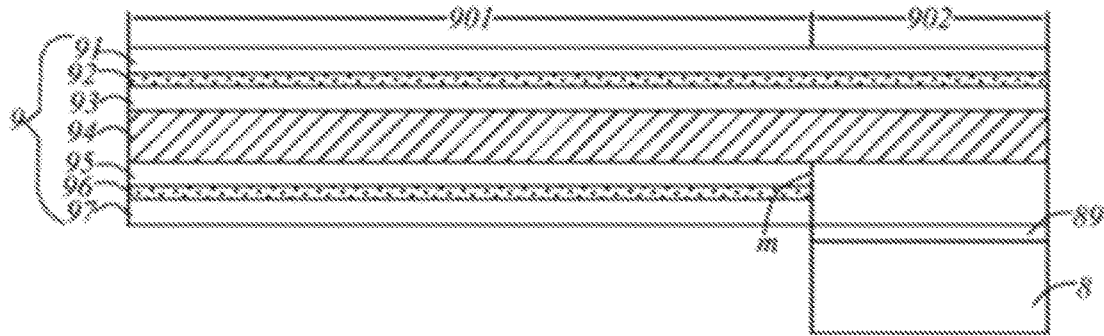
FIG. 1 is a cross-sectional structural diagram illustrating a flexible circuit board secured and connected to an external element in currently available technology.
Figure 2:
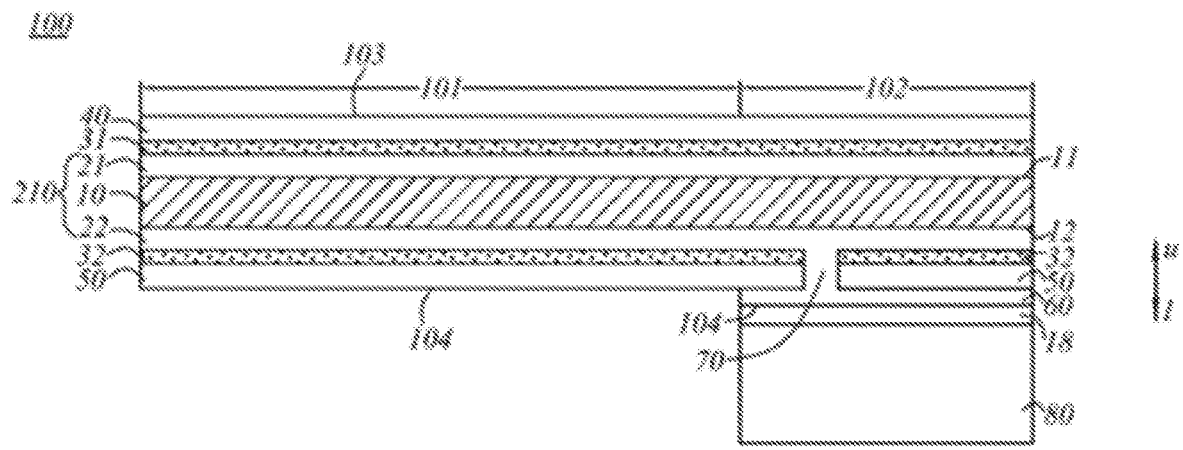
FIG. 2 is a cross-sectional structural diagram illustrating a flexible circuit board secured and connected to an external element according to a first exemplary embodiment of the present disclosure.
Figure 3:
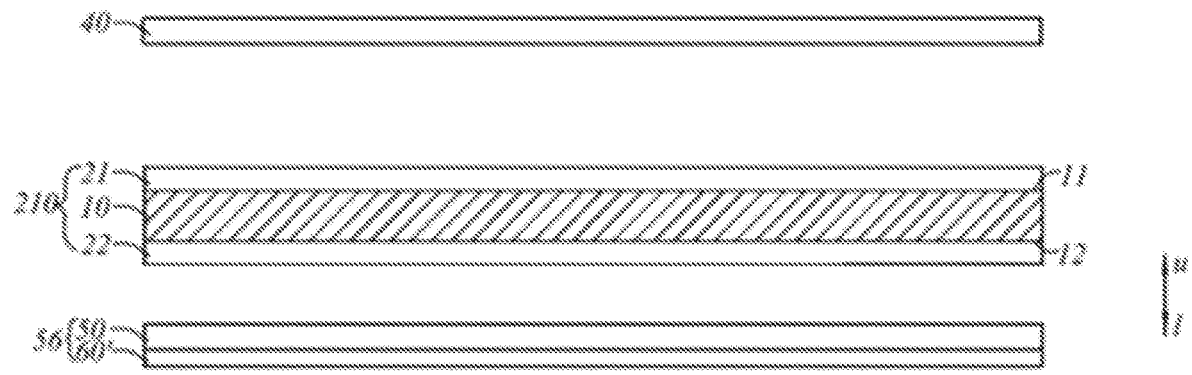
FIG. 3 is a diagram illustrating basic structural components in a manufacturing process of the flexible circuit board according to the first exemplary embodiment of the present disclosure.

FIG. 2 is a cross-sectional structural diagram illustrating a flexible circuit board secured and connected to an external element according to a first exemplary embodiment of the present disclosure. FIG. 3 is a diagram illustrating basic structural components in a manufacturing process of the flexible circuit board according to the first exemplary embodiment of the present disclosure. As illustrated in FIG. 2 and FIG. 3, a flexible circuit board 100 includes a first outer surface 103 and a second outer surface 104 opposing one another. The first outer surface 103 and the second outer surface 104 are two major surfaces of the flexible circuit board 100 having relatively larger surface areas. In order to clearly express the position and direction described in this exemplary embodiment, the direction extending from the second outer surface 104 to the first outer surface 103 (as indicated by the arrow "u" in the figures) is defined as an upward direction, and the direction extending from the first outer surface 103 to the second outer surface 104 (as indicated by the arrow "I" in the figure) is defined as a downward direction.

In other words, the first outer surface 103 is the upper surface of the flexible circuit board 100, and the second outer surface 104 is the lower surface of the flexible circuit board 100.

The flexible circuit board 100 includes a baseboard 210, a strengthening layer 50, and a surface metal layer 60. Each of these components is described in detail below.

The baseboard 210 is the core structure for realizing the basic function of the flexible circuit board 100. The baseboard 210 includes a substrate body 10 and a transmission metal layer. The substrate body 10 includes a substrate upper surface 11 and a substrate lower surface 12 opposing one another. The transmission metal layer is formed on at least one of the substrate upper surface 11 and the substrate lower surface 12. In this exemplary embodiment, the transmission metal layer includes a first electrically conductive layer 21 and a second electrically conductive layer 22.

In this exemplary embodiment, the substrate body 10 is configured to be a single-layer board, and the material of the single-layer board may be a liquid crystal polymer, a polyimide, or Teflon®. The upper surface of the single-layer board constitutes the substrate upper surface 11 of the substrate body 10, and the lower surface of the single-layer board constitutes the substrate lower surface 12 of the substrate body 10. In some alternative embodiments, the substrate body 10 may be a multilayer board structure which includes at least two layers of single-layer boards configured in a stacked arrangement and an inner layer circuit formed between two adjacent layers of the single-layer boards. The material of each layer of the single-layer boards may be a liquid crystal polymer, a polyimide, or Teflon®, and two adjacent layers of the single-layer boards may be adhered and secured by means of an adhesive (for example, a thermoset glue). The upper surface of the top one of the single-layer boards constitutes the substrate upper surface 11 of the substrate body 10, and the lower surface of the bottom one of the single-layer boards constitutes the substrate lower surface 12 of the substrate body 10.

The first electrically conductive layer 21 is formed on the substrate upper surface 11 of the substrate body 10 and constitutes the upper surface of the baseboard 210. The first electrically conductive layer 21 functions as a signal layer to enable the flexible circuit board 100 to further realize its electrical functionality. The first electrically conductive layer 21 may also be referred to as a signal layer. The second electrically conductive layer 22 is formed on the substrate lower surface 12 of the substrate body 10 and constitutes the lower surface of the baseboard 210. The second electrically conductive layer 22 functions as a ground layer to enable the flexible circuit board 100 to further realize its electrical functionality. The second electrically conductive layer 22 may also be referred to as a ground layer.

In this exemplary embodiment, the first electrically conductive layer 21 and the second electrically conductive layer 22 are both made of copper. That is, the upper and lower surfaces of the substrate body 10 are covered with copper.

The strengthening layer 50 may be formed on the transmission metal layer. In this exemplary embodiment, the strengthening layer 50 is formed on the lower surface of the second electrically conductive layer 22 (i.e., the lower surface of the baseboard 210). The strengthening layer 50 is adhered to the lower surface of the second electrically conductive layer 22 by means of an adhesive 32 to protect the second electrically conductive layer 22. Here, the adhesive 32 may be configured to be a thermoset glue. In some alternative embodiments, the strengthening layer 50 may also be formed on the upper surface of the first electrically conductive layer 21 (i.e., the upper surface of the baseboard 210).

The surface metal layer 60 is formed on a portion of an outer surface of the strengthening layer 50. In other words, a portion of the outer surface of the strengthening layer 50 is formed with the surface metal layer 60 and the other portion of the outer surface is not formed with the surface metal layer 60. In this exemplary embodiment, the surface metal layer 60 is formed on a portion of the lower surface of the strengthening layer 50.

The flexible circuit board 100 includes a securing portion 102 and a connecting portion 101. Specifically, the surface metal layer 60 constitutes the securing portion 102 to be secured and connected with an external element 80. In this exemplary embodiment, the external element 80 may be an optical transmitting element and/or an optical receiving element. The lower surface of the surface metal layer 60 may be soldered and secured to the external element 80 through a solder material layer 18. In this exemplary embodiment, the solder material layer 18 may be a tin-based solder material layer. The surface metal layer 60 is electrically connected to the transmission metal layer, which is the second electrically conductive layer 22 in this exemplary embodiment. A portion of the flexible circuit board 100 that is not covered by the surface metal layer 60 constitutes a connecting portion 101. The connecting portion 101 connects and joins with the securing portion 102. The connecting portion 101 may be bent according to design requirements.

In this exemplary embodiment, the flexible circuit board 100 includes the strengthening layer 50 and the surface metal layer 60 formed on a portion of the outer surface of the strengthening layer 50. On one hand, the strengthening layer 50 provides support and protection to the transmission metal layer, which is the second electrically conductive layer 22 in this exemplary embodiment. On the other hand, when the flexible circuit board 100 is electrically connected to the external element 80, there is no need for direct soldering and securing the transmission metal layer, which is the second electrically conductive layer 22 in this exemplary embodiment, to the external element 80. When the flexible circuit board 100 is being used and bent, the probability of breaking the transmission metal layer, which is the second electrically conductive layer 22 in this exemplary embodiment, is significantly reduced, thus improving the structural strength of the flexible circuit board 100.

Further, the flexible circuit board 100 may include one or a plurality of connecting portions 101 and one or a plurality of securing portions 102. The structures of the flexible circuit board 100 at the plurality of securing portions 102 may be configured to be the same or different. In this exemplary embodiment, the structure of the flexible circuit board 100 includes one connecting portion 101 and one securing portion 102.

Further, a solder pad may be formed at the securing portion 102. The flexible circuit board 100 is secured and connected to the external element 80 through the solder pad. The solder pad may be formed in or on the surface metal layer 60 for connecting the external element 80 with the solder material layer 18.

Further, in this exemplary embodiment, the strengthening layer 50 and the surface metal layer 60 together define the second outer surface (lower surface) 104 of the flexible circuit board 100. A portion of the second outer surface 104 of the flexible circuit board 100 is defined by the lower surface of the strengthening layer 50, and the other portion of the second outer surface 104 is defined by the lower surface of the surface metal layer 60.

The strengthening layer 50 includes a first portion and a second portion. The lower surface of the first portion has no surface metal layer 60 formed thereon and constitutes a portion of the lower surface 304 of the flexible circuit board 100. The second portion is held between the surface metal layer 60 and the second electrically conductive layer 22, and the lower surface of the second portion has the surface metal layer 60 formed thereon. In other words, the first portion corresponds approximately to the location of the connecting portion 101 of the flexible circuit board 100, and the second portion corresponds approximately to the location of the securing portion 102 of the flexible circuit board 100.

Further, in this exemplary embodiment, the strengthening layer 50 is a flexible protective medium board that covers the entire lower surface of the second electrically conductive layer 22. The material of the strengthening layer 50 may be a liquid crystal polymer, a polyimide, or Teflon®.

The surface metal layer 60 is made of an electrically conductive metal, for example, copper. The pattern on the surface metal layer 60 is formed by etching.

The flexible circuit board 100 further includes a pore structure 70 through which the surface metal layer 60 is electrically connected to the transmission metal layer. In this exemplary embodiment, an electrically conductive material is arranged in the pore structure 70. The electrically conductive material causes the surface metal layer 60 to be electrically connected to the second electrically conductive layer 22. The pore structure 70 is formed in a middle portion of the securing portion 102. In other words, there is a borderline between the securing portion 102 and the connecting portion 101, and the distance between the pore structure 70 and the borderline is not zero.

Further, in this exemplary embodiment, the flexible circuit board 100 further includes a protective film 40, which is formed at the upper surface of the baseboard 210 and constitutes the first outer surface 103 of the flexible circuit board 100. The protective film 40 is made of an electrically insulating material, for example a polyester film, and is adhered to the upper surface of the first electrically conductive layer 21 (i.e., the upper surface of the baseboard 210) by an adhesive 31. The protective film 40 may be used to protect the first electrically conductive layer 21 that is covered by the protective film 40. Here, the adhesive 31 may be a thermoset glue.

The thickness of the strengthening layer 50 is far less than the thickness of the baseboard 210. In some embodiments, the thickness of the strengthening layer 50 is approximately the same as the thickness of the protective film 40. This can prevent the thickness of the flexible circuit board 100 from being excessively increased to affect product design and drive up costs.

Referring to FIG. 3, one exemplary embodiment of the present disclosure further provides a manufacturing method for the flexible circuit board 100. In reference to the above specific structure of the flexible circuit board 100, the manufacturing method includes the following steps.

First, basic structural components are provided. The basic structural components include the protective film 40, the baseboard 210, and a second baseboard 56. The second baseboard 56 includes the strengthening layer 50 and a metal layer 60' covering one surface of the strengthening layer 50. In this exemplary embodiment, the second baseboard 56 is constituted of the strengthening layer 50 and the metal layer 60', and the metal layer 60' is made of copper. In other words, the second baseboard 56 is a board structure with one side covered by copper.

Then, the protective film 40, the baseboard 210, and the second baseboard 56 are stacked in order and joined by means of adhering. Specifically, the protective film 40 is adhered to the upper surface of the baseboard 210 by an adhesive, and, at the same time, the second baseboard 56, with its metal layer 60' opposing the baseboard 210, is adhered to the lower surface of the baseboard 210 by an adhesive.

Next, the metal layer 60' is etched to form a pattern to obtain the surface metal layer 60. Specifically, according to design needs and the location and distribution of the securing portion 102 and the connecting portion 101, the metal layer 60' within the area of the connecting portion 101 is removed by etching so that the electrically conductive layer 60' remains only within the area of the securing portion 102 to form the surface metal layer 60.

Then, the pore structure 70 is formed at the surface metal layer 60, and an electrically conductive material is filled in the pore structure 70. The electrically conductive material electrically connects the surface metal layer 60 and the second electrically conductive layer 22.

As a result, the flexible circuit board 100 is obtained.

Figure 4:
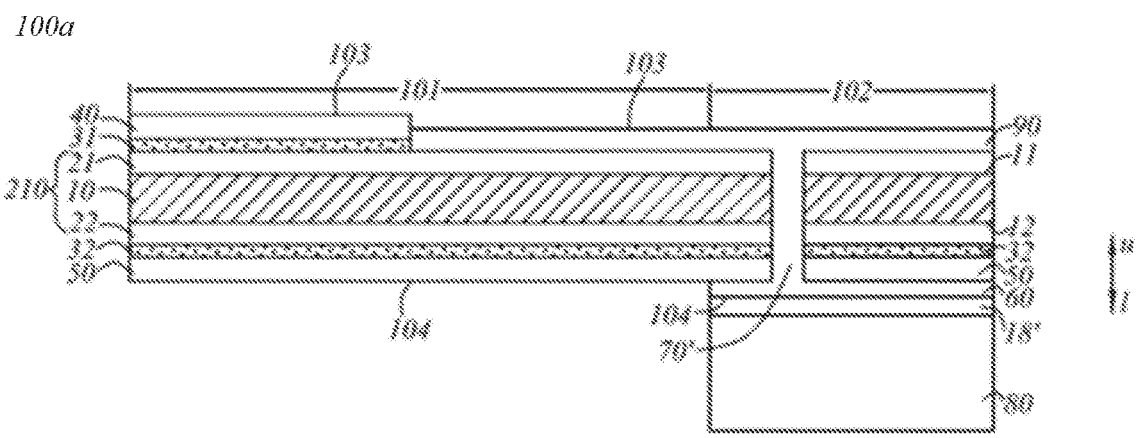
FIG. 4 is a cross-sectional structural diagram illustrating a flexible circuit board secured and connected to an external element according to a second exemplary embodiment of the present disclosure.

FIG. 4 is a cross-sectional structural diagram illustrating a flexible circuit board secured and connected to an external element according to a second exemplary embodiment of the present disclosure. As illustrated in FIG. 4, the second exemplary embodiment differs from the first exemplary embodiment described above in the following respects. In the second exemplary embodiment, a flexible circuit board 100a further includes a gold finger layer 90 formed on the upper surface of the first electrically conductive layer 21 where a window is opened on the protective film 40. The gold finger layer 90 is made of an alloy and is used as a signal transmission terminal (or referred to as a gold finger) of the flexible circuit board 100. Correspondingly, in this exemplary embodiment, the upper surface of the protective film 40 and the upper surface of the gold finger layer 90 together constitute the first outer surface 103 of the flexible circuit board 100. The lower surface of the surface metal layer 60 may be soldered and secured to the external element 80 through a solder material layer 18'. In this exemplary embodiment, the solder material layer 18' is configured to be an alloy-based solder material layer and may be used together with the surface metal layer 60 as the gold finger of the flexible circuit board 100. Additionally, in this exemplary embodiment, the external element 80 is a rigid circuit board. In this exemplary embodiment, the flexible circuit board 100 further includes a pore structure 70' in which an electrically conductive material is arranged. The electrically conductive material causes the gold finger layer 90, the first electrically conductive layer 21, the second electrically conductive layer 22, and the surface metal layer 60 to all be electrically connected.

In comparison with flexible circuit boards provided by currently available technology, in this exemplary embodiment, the addition of the strengthening layer 50 and the surface metal layer 60 significantly decreases the probability of breaking the transmission metal layer at the location where the gold finger layer 90 is located when the flexible circuit board 100 is bend and connected with the external element 80 (such as a rigid circuit board), thereby improving the structural strength.

Figure 5:
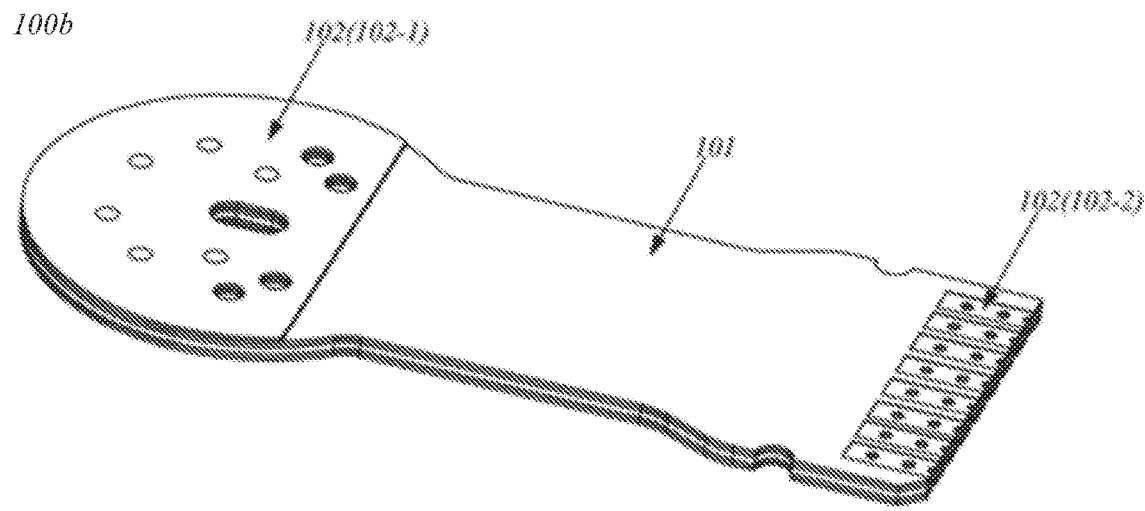
FIG. 5 is a 3-dimensional structural diagram illustrating a flexible circuit board according to a third exemplary embodiment of the present disclosure.

FIG. 5 is a 3-dimensional structural diagram illustrating a flexible circuit board according to a third exemplary embodiment of the present disclosure. As illustrated in FIG. 5, a flexible circuit board 100b provided by the third exemplary embodiment includes a plurality of securing portions 102. A first securing portion 102-1 is configured to have the specific structure in the first exemplary embodiment above (as shown in FIG. 2) and a second securing portion 102-2 is configured to have the specific structure of the second exemplary embodiment above (as shown in FIG. 4). Thus, the flexible circuit board 100b may be secured and connected to different external elements while the structural strength is ensured.

Figure 6:
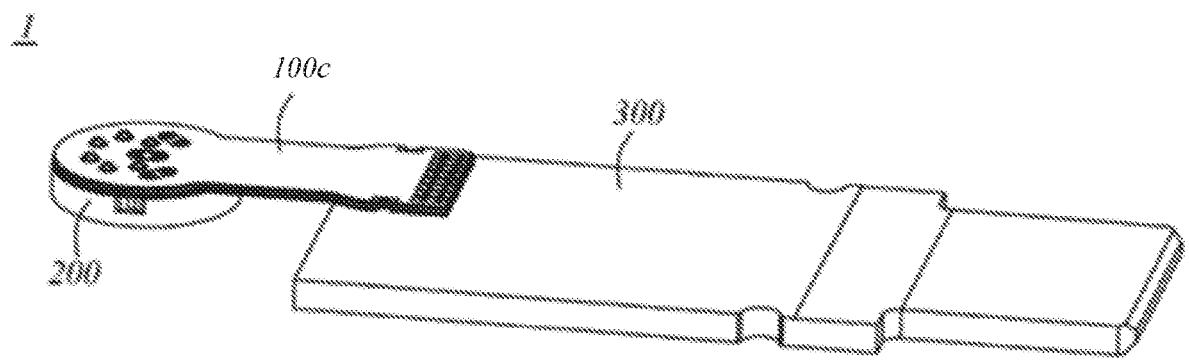
FIG. 6 is a structural diagram illustrating an optical module according to one exemplary embodiment of the present disclosure.

FIG. 6 is a structural diagram illustrating an optical module according to an exemplary embodiment of the present disclosure. As illustrated in FIG. 6, an optical module 1 includes an optical transceiver assembly, and the optical transceiver assembly includes an element 200, a rigid circuit board 300, and a flexible circuit board 100c. The flexible circuit board 100c may have the same structure as the flexible circuit board 100b illustrated in FIG. 5.

The surface metal layer 60 (not shown in FIG. 6) of the flexible circuit board 100c is soldered and connected to a base of an outer metal housing of the element 200, and the flexible circuit board 100 is secured and connected to the element 200 through one securing portion 102. The flexible circuit board 100c is secured and connected to the rigid circuit board 300 through another securing portion 102. Thus, the interconnection between the rigid circuit board 300 and the element 200 may be realized.

Here, the element 200 includes at least one of an optical transmitting element and an optical receiving element, and the flexible circuit board 100 is secured and connected to the optical transmitting element and/or the optical receiving element through the securing portion 102. Correspondingly, interconnection between the optical transmitting element and the rigid circuit board 300 is realized through the flexible circuit board 100, and/or, interconnection between the optical receiving element and the rigid circuit board 300 is realized through the flexible circuit board 100.

Figure 7:
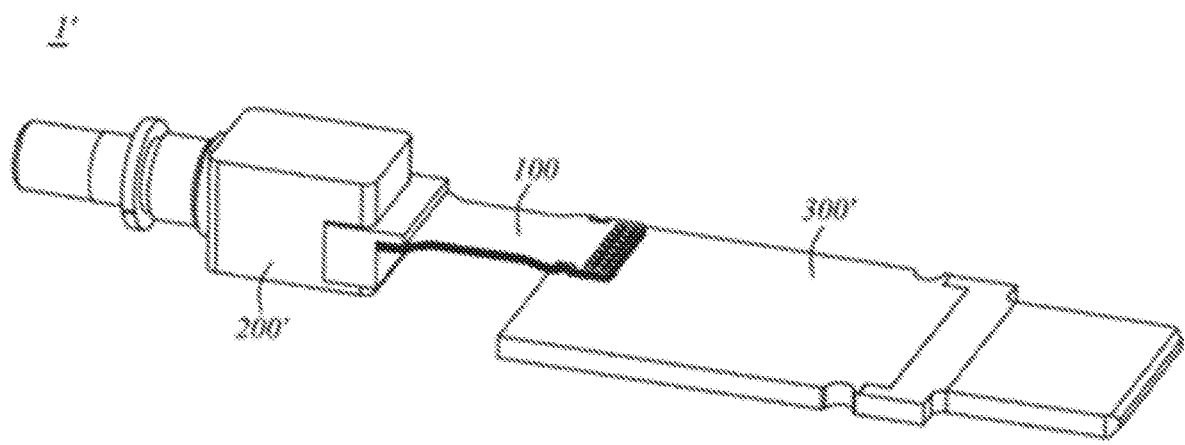
FIG. 7 is a structural diagram illustrating an optical module according another exemplary embodiment of the present disclosure.

FIG. 7 is a structural diagram illustrating an optical module according to another exemplary embodiment of the present disclosure. As illustrated in FIG. 7, an optical module 1' in this exemplary embodiment differs from the exemplary embodiment illustrated in FIG. 6 in the following respect. An element 200' is specifically configured to be a transmitter optical subassembly (TOSA).

In comparison with currently available technology, the present disclosure provides the following benefits. By configuring the strengthening layer 50 and the surface metal layer 60 formed on a portion of an outer surface of the strengthening layer 50, the strengthening layer 50 provides support and protection to the transmission metal layer (for example, the second electrically conductive layer 22 in the first exemplary embodiment) on the one hand. And, on the other hand, there is no need for direct soldering and securing the transmission metal layer (for example, the second electrically conductive layer 22 in the first exemplary embodiment) to the external element 80 when the electrical connection between the flexible circuit board 100 and the external element 80 is being realized. This significantly reduces the probability of breaking the transmission metal layer (for example, the second electrically conductive layer 22 in the first exemplary embodiment) while the flexible circuit board 100 is being used and bent, thus improving the structural strength of the flexible circuit board 100 in its process of use.

It should be understood that despite the descriptions of exemplary embodiments in the specification, each exemplary embodiment does not entail only one single independent technical solution. The specification is written this way simply for the sake of clarity. Those skilled in the art should treat the specification as a whole. The technical solutions associated with the exemplary embodiments may be combined in appropriate ways to form other embodiments that can be understood by persons having ordinary skill in the art.

The series of detailed descriptions above is only intended to provide specific descriptions of feasible embodiments of the present disclosure. The detailed descriptions are not to be construed as limiting the scope of protection for the present invention; all equivalent embodiments or changes that are not detached from the essence of the techniques of the present disclosure should fall under the scope of protection of the present invention.

What is claimed is:

1. A flexible circuit board, comprising:
a substrate body;
a transmission metal layer formed on at least one surface of the substrate body, wherein the transmission metal layer includes a first surface facing the substrate body and a second surface opposite to the first surface;
a strengthening layer formed on the second surface of the transmission metal layer, wherein the strengthening layer includes an inner surface facing the transmission layer and an outer surface opposite to the inner surface; and
a surface metal layer formed on a portion of the outer surface of the strengthening layer,
wherein the surface metal layer of the flexible circuit board constitutes a securing portion for securing and connecting to an external element,
a portion of the flexible circuit board that is not covered by the surface metal layer constitutes a connecting portion that connects to the securing portion; and
the surface metal layer is electrically connected to the transmission metal layer.

2. The flexible circuit board of claim 1, wherein a solder pad is formed at the securing portion for securing and connecting the flexible circuit board to the external element.

3. The flexible circuit board of claim 1, wherein the flexible circuit board further comprises a pore structure and the surface metal layer is electrically connected to the transmission metal layer through the pore structure.

4. The flexible circuit board of claim 3, wherein the pore structure is formed in a middle portion of the securing portion.

5. The flexible circuit board of claim 1, wherein the material of the strengthening layer is a liquid crystal polymer, a polyimide, or Teflon®.

6. The flexible circuit board of claim 1, wherein the flexible circuit board further comprises one or a plurality of the securing portions.

7. The flexible circuit board of claim 1, wherein a pattern of the surface metal layer is formed by etching.

8. The flexible circuit board of claim 1, wherein the substrate body is a multilayer board structure.

9. An optical transceiver assembly, comprising:
- at least one of an optical transmitting element or an optical receiving element; and
- the flexible circuit board of claim 1,
- wherein the flexible circuit board is secured and connected to the at least one of the optical transmitting element or the optical receiving element through the securing portion.

10. An optical module, comprising:
- at least one of an optical transmitting element or an optical receiving element;
- a rigid circuit board; and
- the flexible circuit board of claim 1,
- wherein the flexible circuit board is connected to the at least one of the optical transmitting element or the optical receiving element and the rigid circuit board through the securing portion.

* * * * *

UNITED STATES PATENT AND TRADEMARK OFFICE
CERTIFICATE OF CORRECTION

PATENT NO. : 10,681,804 B2
APPLICATION NO. : 16/190400
DATED : June 9, 2020
INVENTOR(S) : Xigui Fang et al.

It is certified that error appears in the above-identified patent and that said Letters Patent is hereby corrected as shown below:

On the Title Page

Item (72), in the Inventors, "Xigui Fang, Jiangsu (CN); Qin Chen, Jiangsu (CN); Yunfei Hou, Jiangsu (CN); Jie Zhou, Jiangsu (CN)" should read --Xigui Fang, Suzhou (CN); Qin Chen, Suzhou (CN); Yunfei Hou, Suzhou (CN); Jie Zhou, Suzhou (CN)--.

Item (30), in the Foreign Application Priority Data, "2017 1 137497" should read --201711137497.1--.

Signed and Sealed this
Twenty-eighth Day of July, 2020

Andrei Iancu
*Director of the United States Patent and Trademark Office*